United States Patent [19]

Shibata

[11] Patent Number: 5,648,198
[45] Date of Patent: Jul. 15, 1997

[54] RESIST HARDENING PROCESS HAVING IMPROVED THERMAL STABILITY

[75] Inventor: Tsuyoshi Shibata, Fishkill, N.Y.

[73] Assignee: Kabushiki Kaisha Toshiba, Kawasaki, Japan

[21] Appl. No.: 354,921

[22] Filed: Dec. 13, 1994

[51] Int. Cl.$^6$ .................. G03C 5/00; G03F 7/00
[52] U.S. Cl. ............ 430/296; 430/328; 430/313; 430/325; 430/330; 430/396; 156/659.11
[58] Field of Search ................ 430/328, 296, 430/313, 325, 330, 396; 156/659.11

[56] References Cited

U.S. PATENT DOCUMENTS

| | | | |
|---|---|---|---|
| 3,798,053 | 3/1974 | Huemmer | 117/93.31 |
| 4,023,904 | 5/1977 | Sheets | 355/132 |
| 4,443,533 | 4/1984 | Panico | 430/311 |
| 4,814,244 | 3/1989 | Koguchi et al. | 430/30 |
| 4,826,756 | 5/1989 | Orvek | 430/328 |
| 4,840,876 | 6/1989 | Arai | 430/328 |
| 4,900,938 | 2/1990 | Suzuki et al. | 250/442.2 |
| 4,904,866 | 2/1990 | Collins et al. | 250/492.2 |
| 5,001,039 | 3/1991 | Ogoh | 430/311 |
| 5,097,137 | 3/1992 | Ogoh | 250/492.2 |
| 5,236,811 | 8/1993 | Fujiwara | 430/321 |
| 5,300,403 | 4/1994 | Angelopolus et al. | 430/325 |

FOREIGN PATENT DOCUMENTS

| | | | |
|---|---|---|---|
| 57-106029 | 7/1982 | Japan | 430/328 |

OTHER PUBLICATIONS

Ilten et al., "Flash Treatment of Photoresist", IBM Technical Disclosure Bulletin vol. 15 No. 1 (Jun. 1972).

Primary Examiner—John A. McPherson
Attorney, Agent, or Firm—Banner & Witcoff, Ltd.

[57] ABSTRACT

The present invention is directed to a method of hardening a photoresist formed on a patterned layer during photolithograpy, without causing undesirable shrinkage of the resist features. The patterned layer is disposed on a semiconductor substrate, and the photoresist layer is disposed on the patterned layer in a conventional manner. The photoresist layer is irradiated and developed in a conventional manner to have the desired pattern formed therein. The larger features of the developed photoresist layer are irradiated without heat to thereby harden these features, without irradiating the smaller features. The hardening may be performed by screening the smaller features from the radiation applied to the photoresist layer, or by scanning a beam across only the larger features. The radiation may be UV light or an electron beam. Alternatively, all of the features of the photoresist may be hardened by exposure to a basic atmosphere immediately before, during or immediately after irradiation with UV light. In both cases, the features are hardened without shrinkage. After the features are hardened, the photoresist and patterned layer are etched in a conventional manner to transfer the pattern to the patterned layer.

30 Claims, 6 Drawing Sheets

RESIST HARDENING PROCESS HAVING IMPROVED THERMAL STABILITY

BACKGROUND OF THE INVENTION

1. Field of Invention

The invention is directed to a process for hardening a photoresist applied to the surface of a semiconductor wafer during chip fabrication.

2. Description of the Prior Art

Semi-conductor chips are manufactured in a multi-step process. Initially, during the wafer preparation step, semi-conductor crystals are sliced into thin sheets which are polished to free them of surface irregularities. Thereafter, the prepared wafers undergo fabrication in which devices such as integrated circuits or chips are imprinted. Each chip carries multiple thin layers of conducting metals, semiconductors and insulating materials. Layering may be accomplished by growing or by deposition. After a layer is applied, it is further processed in a series of patterning steps, in which portions of the added layer are removed. Doping and heat treatment steps also are necessary during chip fabrication. A plurality of layers are applied, patterned, doped and heat treated during fabrication to create the finished chip.

Photolithography is a multi-step process and is one of the basic techniques used in patterning. With reference to FIG. 1a, conventional semiconductor substrate 1 includes layer 2 disposed thereon in a conventional manner. The object of photolithography is to pattern layer 2 and thus layer 2 generally is referred to as the patterned layer. Patterned layer 2 may be made of a metal, oxide or semiconductor material, and is patterned during photolithography by selectively removing material at specified locations. Photoresist layer 3 is applied to the surface of patterned layer 2 in a conventional manner and is made of a conventional light sensitive material which changes properties when exposed to light. For example, photoresist layer 3 may be a polyvinylphenol (PVP). Photoresist layer 3 is selectively exposed to light such as X-ray or ultraviolet light by making use of mask 4 which blocks transmission of light to photoresist layer 3 at selective locations. The pattern of mask 4 matches the pattern which ultimately is to be formed in patterned layer 2.

The properties of the exposed surface area of photoresist layer 3 are changed by the exposure. For example, the exposed surface area may be made it insoluble to certain chemical solvents which are used as developers. Accordingly, by applying developer to exposed photoresist layer 3, the surface area thereof which has been exposed to the light and made insoluble is removed by the developer to leave holes in photoresist layer 3 which correspond to the unblocked region in mask 4. As shown in FIG. 1b, the holes isolate a plurality of islands 3a which correspond to mask 4. In other words, the pattern of mask 4 is transferred to photoresist layer 3 during development.

The pattern of photoresist layer 3 which now has the form of islands 3a is transferred to patterned layer 2 by a conventional etching process, for example, by wet etching in which the substrate is immersed in a tank of chemical etchant. Photoresist layers are etch resistant, that is, they do not dissolve in chemical etching solutions. Accordingly, the areas of patterned layer 2 which are covered by polymerized photoresist islands 3a are not dissolved in the etching solution thereby forming features 2a. The areas which are not covered are removed by the etching to create openings or trenches between features 2a, thereby completing transfer of the desired pattern to patterned layer 2. Thereafter, islands 3a are removed by a conventional process, for example, by wet chemical or plasma stripping which does not affect either patterned layer 2 or substrate 1. As a result, as shown in FIG. 1d, substrate layer 1 is formed to have a desired patterned layer 2 thereon. A conventional photolithograpy process is described in U.S. Pat. No. 5,001,039 to Ogoh, incorporated by reference.

At various times during the photolithography process, substrate 1 having layers 2 and 3 thereon is subjected to high temperatures. For example, the developed substrate (FIG. 1b) is subjected to high temperatures during etching, for example, temperatures up to about 150° C. The high temperatures cause thermal flow and rapid volume reduction of the photoresist material, and a resultant profile degradation. For example, developed photoresist layer 3 having both small features 3a and a large feature 3b is shown in FIG. 2a. Both the large and small features have relatively regular, well-defined shapes, that is, they have relatively straight upper and side surfaces. However, due to thermal flow and volume reduction, the large and small features assume the irregular shapes shown in FIG. 2b in which the upper surfaces become relatively rounded. The larger photoresist features undergo more volume reduction than the smaller photoresist features and thus, in general, the larger features undergo greater profile degradation than the smaller features at the edges of the photoresist pattern.

The problems which result from the profile degradation illustrated in FIGS. 2a–b are shown in FIGS. 3a–c. FIGS. 3a and 3b are overhead and cross-sectional views, respectively, of a portion of substrate 1 having patterned layer 2 and developed photoresist layer 3 thereon. In this instance, the development of photoresist layer 3 has created relatively large features defining an island 3c devoid of the resist material. The results of the etching process are shown in FIG. 3c. Due to the large profile degradation of large features 3b of photoresist layer 3 which resulted in the formation of an irregular surface during etching, irregularly shaped features are formed in patterned layer 2. The irregular features define opening or trench 10 which has an irregular shape. In particular, trench 10 is formed with tapered instead of vertical side walls, giving the trench an overall V-shape with a widened bottom. The width of the features of patterned layer 2 is critical to the formation of circuits which function in accordance with the desired design criteria. Accordingly, a finished patterned layer 2 including irregularly shaped trench 10 having a width which varies from top to bottom could result in a defective circuit.

A similar situation is shown in FIGS. 4–c. In this situation developed photoresist layer 3 includes a plurality of relatively small features 3a defining a plurality of islands therebetween which are void of resist material. As shown in FIG. 4c, though the etching process causes profile degradation of small features 3a, the degradation is less than that of large features 3b as in FIG. 3c. Thus, after etching the features of patterned layer 2 are less irregular than the features of patterned layer 2 in FIG. 3c. In some instances, the effect of profile degradation on the final shape of the features of the patterned layer may be minimal enough so that after etching the features of the patterned layer are still within desired design parameters. Of course, whether the degree of profile degradation and the resultant effect upon the features of the patterned layer is acceptable ultimately depends upon the critical dimensions tolerance of the chip and the etching performance.

In order to overcome the drawbacks resulting from profile degradation, it is necessary to harden the developed photoresist layer before proceeding with the etching process. One manner of hardening known in the prior art is hard baking, in which the substrate having patterned layer 2 and photoresist layer 3 thereon is baked in an oven, for example, at 130° C. for approximately two minutes. The baking drives water and solvents out of the photoresist and further polymerizes photoresist layer 3 to make it more etch resistant. However, the upper limit of the hard bake is set by the thermal flow point of the resist. If this limit is exceeded, profile degradation occurs even before etching. Accordingly, hard baking is insufficient to resist the degradation experienced during the etching itself.

Another prior art technique for hardening includes heating the developed photoresist layer with simultaneous exposure to Ultraviolet (UV) radiation. This technique can be performed with a conventional UV lamp with the substrate disposed on a conventional hot plate. A device for performing this function is disclosed in U.S. Pat. No. 4,900,938 to Suzuki et at, incorporated by reference. With reference to FIG. 5, device 20 includes support 22 disposed in isolated chamber 24. Support 22 includes heater 26 disposed therein, which includes cooling conduits 28 and lead wire 30 for connecting to a power source. UV radiation provided by lamp 32 reflects off of mirror 34 and is projected through window 36 and shutter 38. Device 20 also includes an intake 40 and exhaust hole 42 which allow for evacuation of atmospheric gases and filling of the chamber with inert gases. In order to effectively harden the resist without creating thermal flow, the UV radiation should be at a wavelength of 200–400 nm, and the temperature should be at least 0° C. and not exceed 90° C. However, this prior art method of hardening causes pattern shrinkage of the features of photoresist layer 3. For example, the line width of the resist features may be decreased by 10%.

During chip fabrication, it is desired to form features in patterned layer 2 having the smallest possible spacing. In some cases it is desired to form patterned layer features which have spacings therebetween of as little as 0.25 μm. The pattern shrinkage discussed above makes it difficult to achieve spacings which are this small. FIG. 6a shows in representative cross section a plurality of resist features 3a having a line width 1 and spacing s both before (upper view) and after (lower view) treatment by the above-discussed hardening process combining UV irradiation and heat. As shown, before treatment line width l is approximately equal to spacing s, for example, both 1 and s may be approximately equal to 0.25 μm. However, after treatment, due to pattern shrinkage, the line widths l decrease, resulting in a corresponding increase in the spacing s between features. For example, the spacing may increase to 0.28 μm. The increase in spacing s will be transferred to the patterned layer and thus, the desired close spacing will not be achieved.

With reference to FIG. 6b, in order to ensure that the features of photoresist layer 3 and thus the features of patterned layer 2 will be spaced sufficiently close to each other, photoresist layer 3 could be developed with features which are spaced extremely close to each other, as shown in the upper view. For example, the features may have line widths 1 approximately equal to 0.28 μm, and may have a spacing of approximately 0.22 μm. Thus, even after the pattern shrinkage and corresponding increase in spacing s caused by the hardening process, the spacing s still will be sufficiently small. For example, after hardening, both the line spacing s and line width 1 may become 0.25 μm, as shown in the lower view. Thus, after etching, the features of patterned later 2 also would be spaced sufficiently close together. However, in practice, it is extremely difficult to achieve spacings of 0.2–0.22 μm in developed photoresist layer 3. Such spacings require the use of photomasks having extremely high resolution, and production of such masks are not practical.

Current photolithography processes may provide developed photoresist layers having spacing s approximately equal to about 0.25 μm. However, as discussed, the shrinkage of the features which results from the known hardening processes results in an unsatisfactory increase in spacing s of the photoresist features, and a corresponding unsatisfactory increase in the spacing of the features in the patterned layer. For example, the line widths may shrink to about 0.22 μm and the spacing may increase to about 0.28 μm. Thus, shrinkage of the photoresist layers during the hardening process results in a limit on how closely the features of the patterned layer can be formed to each other. Alternatively, the shrinkage caused by the known hardening processes may be taking into account by forming the photoresist layer to have features which are spaced extremely close to each other, for example, 0.22 μm. After the pattern shrinkage and corresponding increase in spacing, the features of the photoresist and thus of the patterned layer still would have a satisfactory small spacing. However, in practice, it is not practical to form developed photoresist layers with spacings this small due to the practical limits on the resolution of the photomasks. Accordingly, there is a practical limit to how closely the features of the patterned layer can be spaced from each other in prior art patterning methods.

SUMMARY OF THE INVENTION

The present invention is directed to a method for patterning a layer disposed on a semiconductor substrate. The method includes disposing a photoresist on the layer and developing the photoresist into a predetermined pattern. The pattern includes at least a first feature having a first width and a second feature having a second width which is greater than the first width. The method further includes irradiating the second feature by application of a light source, and not irradiating the first feature with the light source. The substrate is etched to pattern the layer.

In a further embodiment, the second feature is irradiated by applying UV radiation to the second feature, and the first feature is screened from the UV radiation.

In a further embodiment, the second feature is irradiated by scanning with an electron beam.

In a further embodiment, the invention is directed to a method for hardening a photoresist developed upon a layer formed upon a semiconductor substrate. The photoresist is developed to have a plurality of features. The method includes exposing the photoresist to a basic atmosphere and irradiating the photoresist with UV light.

DETAILED DESCRIPTION OF THE PREFERRED EMBODIMENTS

Figure 7A:
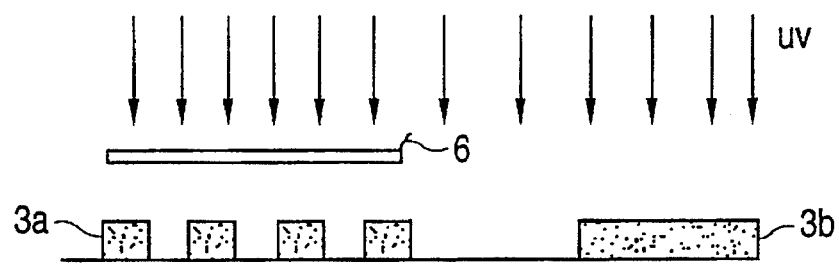
FIGS. 7a–7b are side views showing photoresist features treated according to the inventive method.
Figure 7B:
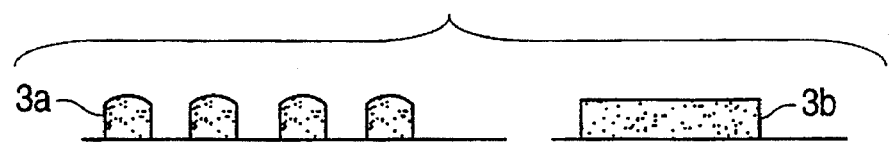

With reference to FIGS. 7a–b, a method for hardening photoresists according to the present invention will be described. It has been determined that photoresist features may be sufficiently hardened against profile degradation by application of UV irradiation without heat. Further, application of UV irradiation in the absence of heat results in only minimal pattern shrinkage because as explained further below with reference to FIGS. 9–10, the deblocking and volatization of the protection group OR found in the photoresist material is minimized. It is this deblocking which is responsible for the pattern shrinkage.

In FIG. 7a, UV radiation is applied so as to cover the entire surface area of the developed photoresist. However, mask 6 which is opaque to UV radiation is disposed to cover the smaller resist features 3a. Mask 6 does not block large feature 3b. The ambient temperature of the substrate and layers disposed thereon is not raised, that is, the photoresist is not subjected to heat which would cause it to undergo thermal flow. The temperature is maintained below 90° C., and preferably at room temperature. Accordingly, large feature 3b of the resist pattern is hardened against thermal flow and rapid volume reduction by irradiation with UV light without application of heat. However, without application of heat, large feature 3b will undergo only minimal pattern shrinkage because excessive pattern shrinkage due to the deblocking and volatization of the protection group is minimized. For features having a width of 1 μm or greater, the shrinkage will be less than 5% of the width.

It has been determined that large features 3b will be provided with sufficient thermal stability with this minimal shrinkage if the intensity of the applied UV light is at least 120 mW/m$^2$, at a wavelength of less than 400 nm. In a preferred embodiment, the wavelength of the UV will be less than 300 nm.

Figure 1A:
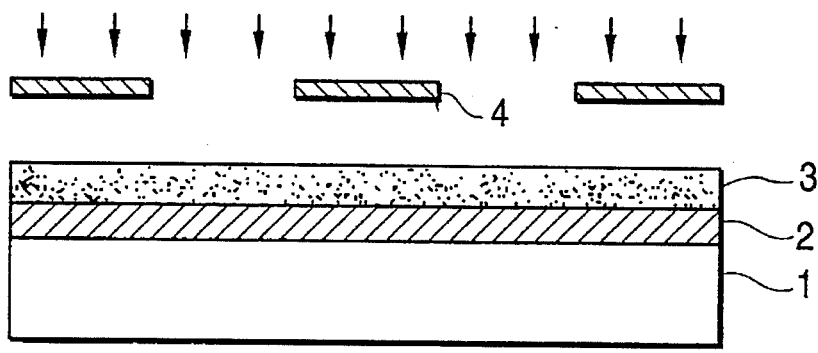
FIGS. 1a–1d are cross-sectional views showing a substrate and layer thereon being patterned in various steps of a prior art photolithography process.
Figure 1B:
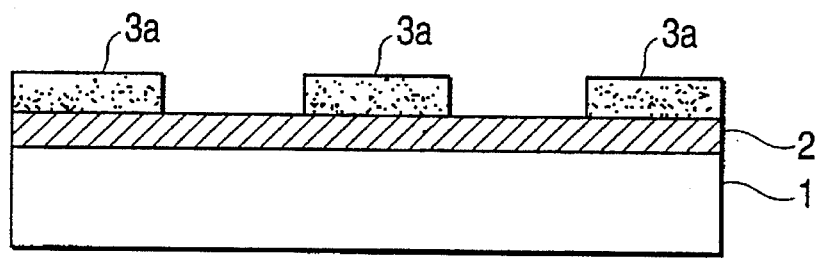
Figure 1C:
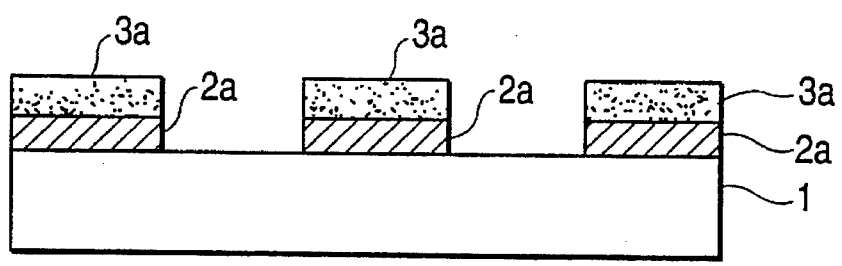
Figure 1D:
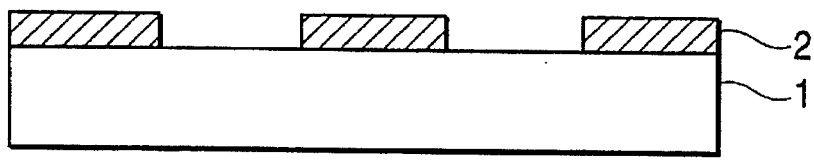
Figure 2A:
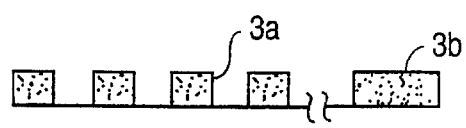
FIGS. 2a–b are cross-sectional views of a developed photoresist layer before and after application of heat during the etching process, respectively, according to the prior art.
Figure 2B:
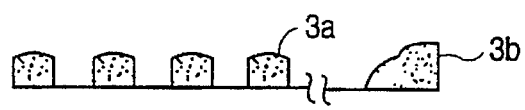
Figure 3A:
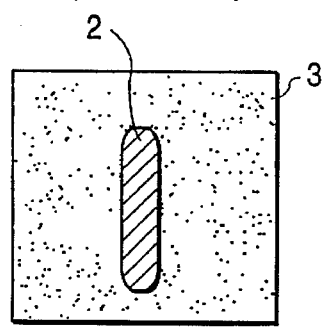
FIGS. 3a and 3b are overhead and cross-sectional views of a substrate having a developed photoresist layer thereon, according to the prior art.
Figure 4A:
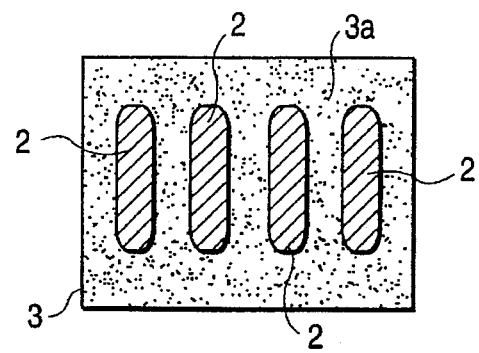
FIGS. 4a and 4b are overhead and cross-sectional views of a substrate having a developed photoresist layer thereon, according to the prior art, and with a different pattern than that of FIGS. 3a–b.
Figure 3B:
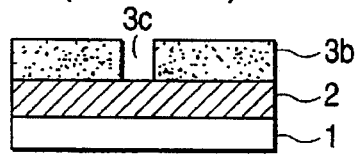
Figure 4B:
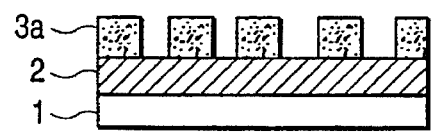
Figure 3C:
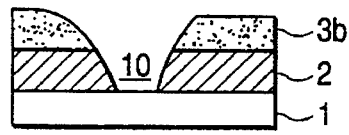
FIG. 3c is a cross-sectional view of the substrate shown in FIGS. 3a–b after the etching process.

FIG. 7b shows the result of the etching process. As a result of the hardening process described in FIG. 7a, large feature 3b is sufficiently hardened so as to not suffer profile degradation when subjected to the high heat during etching as shown in FIG. 2b. Thus, the etching irregularities in the features of the pattern layer shown in FIG. 3c will not occur. Furthermore, the above-described etching process results in only minimal pattern shrinkage, for example, less than 5%. Thus, the desired minimal spacing between the features of the photoresist layer and the corresponding desired small spacing between the features of the patterned layer can be achieved without requiring the use of masks having impractical levels of resolution. In a preferred embodiment, features having a line width greater than 1 μm will be irradiated.

Figure 4C:
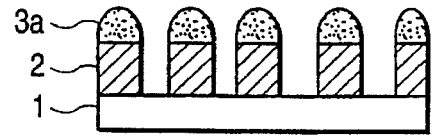
FIG. 4c is a cross-sectional view of the substrate shown in FIGS. 4a–b after the etching process.
Figure 5:
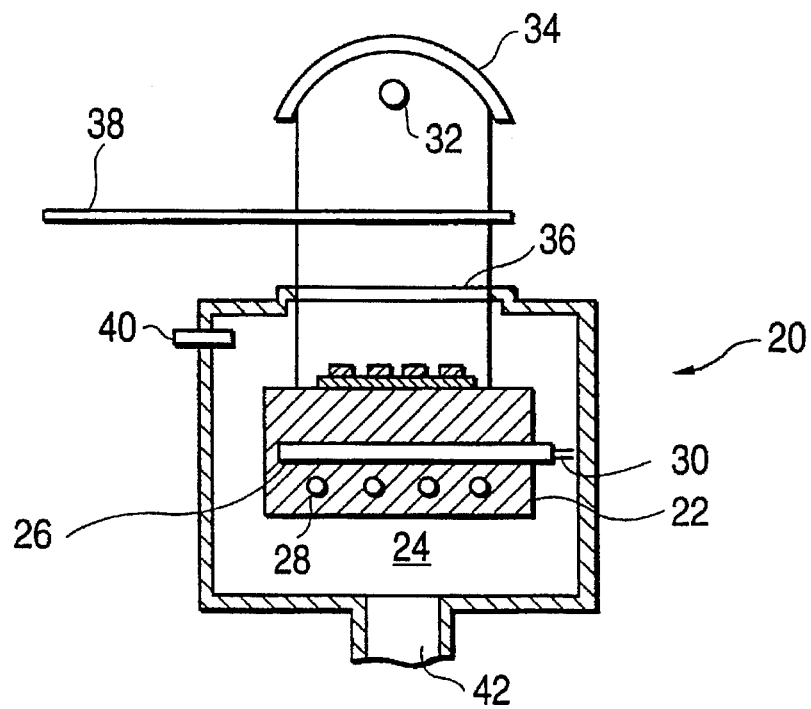
FIG. 5 is a side view of a prior art apparatus which may be used to treat photoresists with heat and UV radiation.
Figure 6A:
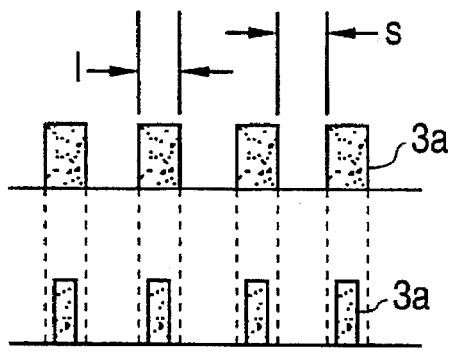
FIGS. 6a–6b are side views showing the shrinkage experienced by photoresist features when treated with heat and UV.
Figure 6B:
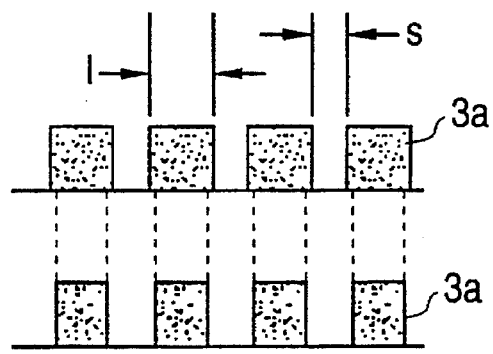

Although the not hardened smaller features 3a will undergo some profile degradation during etching, as discussed with respect to FIG. 4c, this limited degradation will not cause irregularities in the patterned layer because the profile degradation for smaller features is negligible, as discussed above. Since smaller features 3a have not been subjected to UV irradiation, they will not undergo pattern shrinkage. Even if smaller features 3a are subjected to UV irradiation, the pattern shrinkage still would be minimal. However, the use of mask 6 to block the UV irradiation may be necessary when the line widths and spacing of the small features are close to the limits of the photolithograpy process. In a preferred embodiment, features having line widths of less than 0.3 μm will be blocked.

Without hardening, features of a photoresist layer having line widths less than 0.5 μm, will not suffer profile degradation during etching to a degree which would result in feature irregularities in the patterned layer. Thus, such features need not be hardened by application of UV irradiation and will undergo no pattern shrinkage. Features having line widths greater than 1.0 μm may be hardened by UV irradiation alone. These features will undergo no profile degradation because of the hardening process, and will undergo only minimal pattern shrinkage since no heat is applied. Accordingly, photoresist layers having features spaced sufficiently close together so as to allow for patterned layer features which are spaced desirably close to each other can be achieved from the photolithograpy process without requiring production of masks having extremely high resolution. For example, features which are spaced at about 0.25 μm before the photoresist is hardened will remain spaced at about 0.25 μm after hardening. Furthermore, the invention is applicable for both MUV and DUV photoresists.

Figure 8:
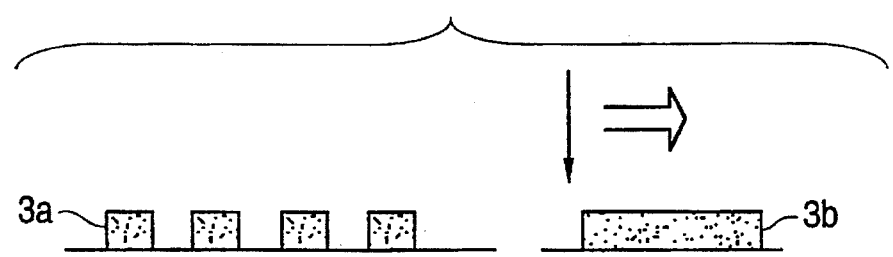
FIGS. 8 is a side view showing photoresist features treated according to the inventive method.

With reference to FIG. 8, an alternative manner for applying irradiation in the hardening process is shown. A relatively narrow electron beam is applied selectively to the developed photoresist. In particular, the electron beam is applied at one edge of large feature 3b of the resist pattern, and is swept across the large feature to the opposite edge. The beam is not applied to the small features 3a. Accordingly, large feature 3b is hardened and small features 3a are not hardened. The electron beam has a dose of 40 μC. with an acceleration voltage of 14 keV. The scanning may be performed by prior art electron beam scanning devices. Alternatively, conventional blanket electron beam exposure tools may be used. Scanning with UV light may also be used.

Figure 9A:
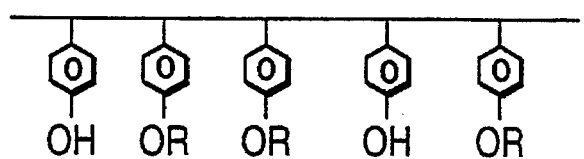
FIGS. 9a–9d show the deblocking and volatization which cause shrinkage of the photoresist during prior art hardening methods.

With reference to FIGS. 9a–d and 10, an alternative method for hardening developed photoresist layers without pattern shrinkage is shown. In FIG. 9a, a conventional photoresist material is shown, for example, polyvinylphenol (PVP) resin, which includes a vinyl group backbone, and a side chain of phenol molecules bound to the backbone. As shown, in many of the phenol molecules, the unfunctionalized hydroxyl group OH is replaced by an alkyl protection group OR. The protection group is repeatedly substituted for the hydroxyl group at predetermined locations along the sequence, for example, as shown, only every third group may be the unfunctionalized hydroxyl group OH. A PVP resin including the alkyl protection group may be made by a conventional chemical process. A typical protection group may be a t-buthoxy carbonyl group or a derivative thereof.

Figure 9B:
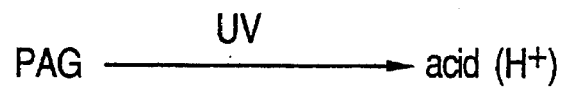
Figure 9C:
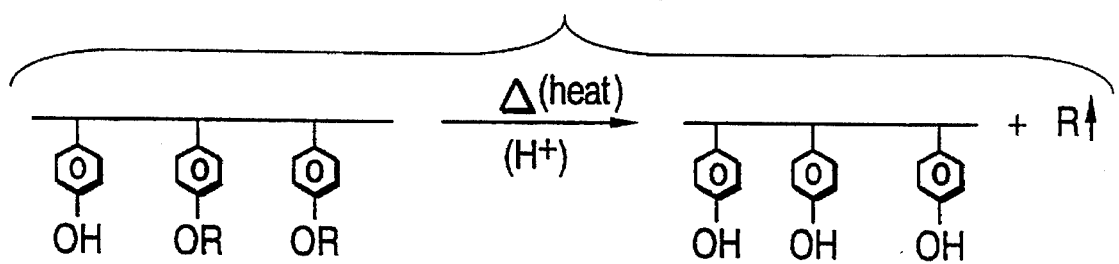

The conventional photoresist shown in FIG. 9a includes a photoacid generator (PAG). As shown in FIG. 9b, when a PAG is subjected to UV radiation, acid (H⁺) is released. As shown in FIG. 9c, when heat is applied to the conventional photoresist material in the presence of acid, a deblocking reaction occurs in which the OH group replaces the protection group OR. The protection group is volatized, that is, released from the PVP photoresist as a gas.

Figure 9D:
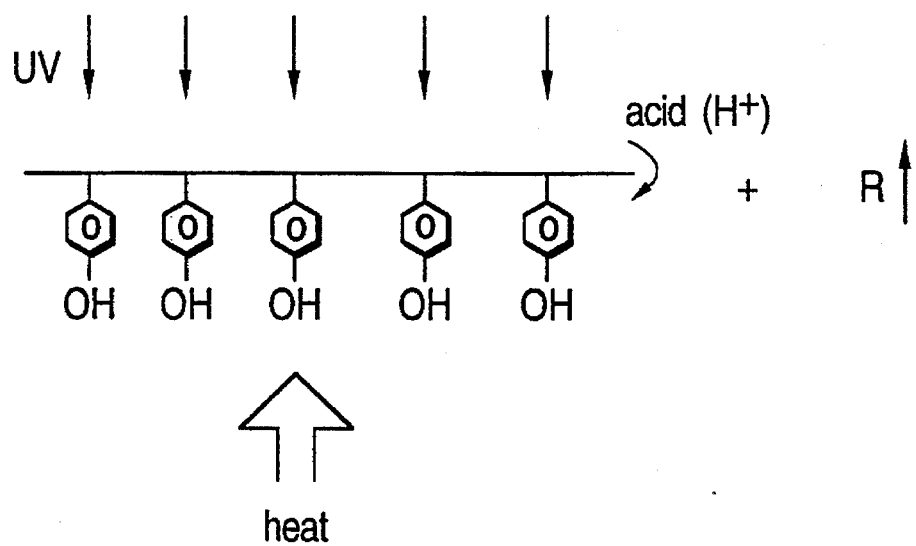

As shown in FIG. 9d, during conventional hardening, both UV and heat are applied. Thus, acid is released from the photo-acid generator (PAG) in the photoresist and deblocking occurs, that is, the OH group replaces the protection group OR. The protection group OR is volatized. Deblocking and volatization of the protection group OR is a major cause of the volume reduction and thus pattern shrinkage of the developed photoresist layer. If all of the protection groups are deblocked and volatized, a 10% volume reduction will occur.

Figure 10:
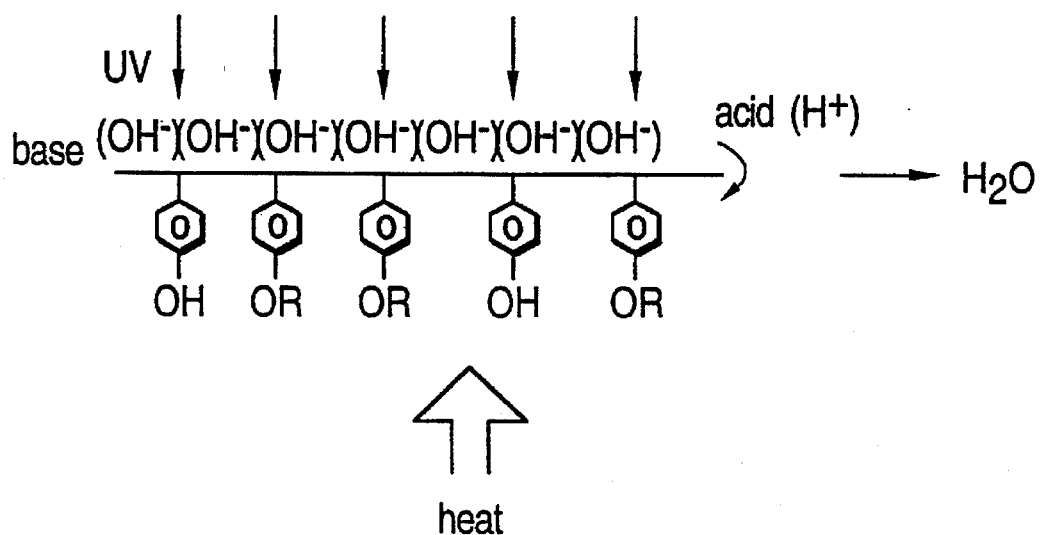
FIG. 10 shows a process for treating photoresists according to a second embodiment of the invention.

With reference to FIG. 10, the manner in which the present invention overcomes volatization of the protection group OR and thus volume reduction is shown. The developed photoresist is exposed to a basic atmosphere (OH⁻) which neutralizes the acid (H⁺) released during the UV irradiation. Accordingly, even if heat is simultaneously applied, the deblocking and volatization of the protection groups is substantially eliminated, and as a result, pattern shrinkage is avoided. Preferably, application of the basic atmosphere occurs simultaneously with application of UV irradiation or immediately thereafter, for example, within five seconds so as to minimize deblocking. Alternatively, the developed photoresist can be flooded with the basic atmosphere no more than ten seconds prior to irradiation. The basic atmosphere can be applied in a conventional manner, for example, by prime treatment with NH₃, hexamethyldisilazane (HMDS) or other organic amines (basic gases). The base can be applied in liquid form as well, for example, by soaking the resist in basic liquids, for example, NH₃ or tetramethyl-ammoniumhydroxide (TMAH).

This invention has been described in detail in connection with the preferred embodiments. These embodiments, however, are merely for example only and the invention is not restricted thereto. It will be understood by those skilled in the art that other variations and modifications can easily be made within the scope of this invention as defined by the claims.

I claim:

1. A method for patterning a layer disposed on a semiconductor substrate, said method comprising:
    disposing a photoresist on the layer;
    forming a pattern in the photoresist, the pattern including at least a first feature having a first width and a second feature having a second width which is greater than the first width;
    irradiating the second feature with radiation and not irradiating the first feature with the radiation; and
    etching the layer having the photoresist thereon to pattern the layer.

2. The method recited in claim 1, the irradiating step including applying UV radiation to the second feature, the method further including simultaneously screening the first feature from the UV radiation.

3. The method recited in claim 2, the UV radiation having a wavelength less than 300 nm.

4. The method recited in claim 2, the UV radiation having an intensity of at least 120 mW/m².

5. The method recited in claim 2, the UV radiation having a wavelength less than 400 nm.

6. The method recited in claim 2, the UV radiation having an intensity of at least 120 mW/m² and a wavelength less than 400 nm.

7. The method recited in claim 1, the irradiating step including scanning the second feature with an electron beam.

8. The method recited in claim 7, the electron beam having a dose of 40 µC.

9. The method recited in claim 4, the electron beam having an acceleration voltage of 14 keV.

10. The method recited in claim 4, the electron beam having a dose of 40 µC and an acceleration voltage of 14 keV.

11. The method recited in claim 1, the photoresist formed to have a plurality of first features each having a substantially identical first width, the first width being substantially equal to the spacing between the first features.

12. The method recited in claim 1 wherein during the irradiating step the temperature of the photoresist is maintained at less than 90° C.

13. The method recited in claim 1, the photoresist formed of polyvinylphenol.

14. The method recited in claim 1, the first width being about 0.3 µm and the second width being greater than 1 µm.

15. The method recited in claim 1, the layer being formed of a material selected from the group consisting of a metal, an oxide and a semiconductor.

16. The method recited in claim 1, the first width being 0.5 µm or less.

17. The method recited in claim 1, the first width being 0.3 µm or less.

18. The method recited in claim 1, the second width being greater than 1.0 µm.

19. The method recited in claim 1, the first width being 0.5 µm or less and the second width being greater than 1.0 µm.

20. The method recited in claim 1, the first width being 0.3 µm or less and the second width being greater than 1.0 µm.

21. A method for hardening a photoresist developed upon a layer formed upon a semiconductor substrate, the photoresist developed to have a plurality of first features spaced from each other and having substantially the same width and at least one second feature spaced from said first features and having a width which is greater than the width of the first features, said method including:
    disposing a mask over said first features and
    projecting radiation upon the photoresist, wherein,
    the radiation irradiates and thereby hardens the second feature, and the mask is opaque to the radiation such that the radiation does not irradiate the first features.

22. The method recited in claim 21, the first features having a width of about 0.3 µm and the second feature having a width of at least 1 µm.

23. The method recited in claim 21, the radiation comprising UV light having a wavelength less than 300 nm.

24. The method recited in claim 21, the radiation comprising an electron beam.

25. The method recited in claim 21, further comprising maintaining the second feature at a temperature less than 90° C.

26. A method for hardening a photoresist developed upon a layer formed upon a semiconductor substrate, the photoresist developed to have a plurality of first spaced features having substantially the same width and at least one second feature spaced from said first features and having a width which is greater than the width of the first features, said method including:
    directing radiation at a location at one side of the second feature and
    scanning the radiation over the second feature without scanning the first features, wherein, the radiation irradiates and thereby hardens the second feature, and does not irradiate the first features.

27. The method recited in claim 6, the first features having a width of about 0.3 μm and the second feature having a width of at least 1 μm.

28. The method recited in claim 27, the radiation comprising UV light having a wavelength of less than 300 nm.

29. The method recited in claim 27, the radiation comprising an electron beam.

30. The method recited in claim 27, further comprising maintaining the second feature at a temperature less than 90°.

* * * * *